(12) United States Patent
Yamashita

(10) Patent No.: US 7,623,056 B2
(45) Date of Patent: Nov. 24, 2009

(54) PHOTOELECTRIC CONVERSION APPARATUS

(75) Inventor: Yuichiro Yamashita, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 7 days.

(21) Appl. No.: 12/166,554

(22) Filed: Jul. 2, 2008

(65) Prior Publication Data

US 2009/0009372 A1    Jan. 8, 2009

(30) Foreign Application Priority Data

Jul. 6, 2007   (JP)   ............... 2007-178394

(51) Int. Cl.
    *H03M 1/34*   (2006.01)
(52) U.S. Cl. .................. 341/163; 250/370.11; 348/308
(58) Field of Classification Search ......... 341/155–170; 348/308, 302, 311, 315, 312, 279, 296, E3.018; 250/208.1, 201.8, 201.2, 370.11, 370.08, 250/370.09
See application file for complete search history.

(56) References Cited

U.S. PATENT DOCUMENTS

| | | | |
|---|---|---|---|
| 6,184,511 B1 * | 2/2001 | Yamashita | ............... 250/201.2 |
| 6,858,827 B2 * | 2/2005 | Sugiyama et al. | ........ 250/208.1 |
| 6,906,332 B2 * | 6/2005 | Tashiro et al. | .......... 250/370.11 |
| 6,965,408 B2 * | 11/2005 | Hiyama et al. | ............. 348/308 |
| 6,989,540 B2 * | 1/2006 | Morii et al. | ............ 250/370.11 |
| 2005/0270282 A1 | 12/2005 | Kawaguchi | |
| 2007/0046795 A1 | 3/2007 | Yamashita | |
| 2008/0036890 A1 | 2/2008 | Yamashita et al. | .......... 348/308 |

FOREIGN PATENT DOCUMENTS

| | | |
|---|---|---|
| JP | 2000-099694 A | 4/2000 |
| JP | 2002-027331 A | 1/2002 |
| JP | 2005-136540 A | 5/2005 |
| JP | 2005-347931 A | 12/2005 |
| JP | 2005-348325 A | 12/2005 |
| JP | 2007-251680 A | 9/2007 |

* cited by examiner

*Primary Examiner*—Lam T Mai
(74) *Attorney, Agent, or Firm*—Fitzpatrick, Cella, Harper & Scinto

(57) ABSTRACT

Providing a configuration that, when an AD converter is provided for each of pixel columns, enables each of the elements to be arranged without increasing the element arrangement pitch. A photoelectric conversion apparatus according to the present invention includes a plurality of AD converters. The AD converter includes: an arithmetic operation amplifying circuit unit, a comparator circuit unit for comparing, with a reference signal, an output from the arithmetic operation amplifying circuit unit; a DA converted circuit unit for DA converting a signal based on a signal from the comparator circuit unit; and a sampling and holding unit arranged at an input section of the arithmetic operation amplifying circuit unit. The DA converted circuit unit is arranged between the comparator circuit unit and the arithmetic operation amplifying circuit unit.

6 Claims, 5 Drawing Sheets

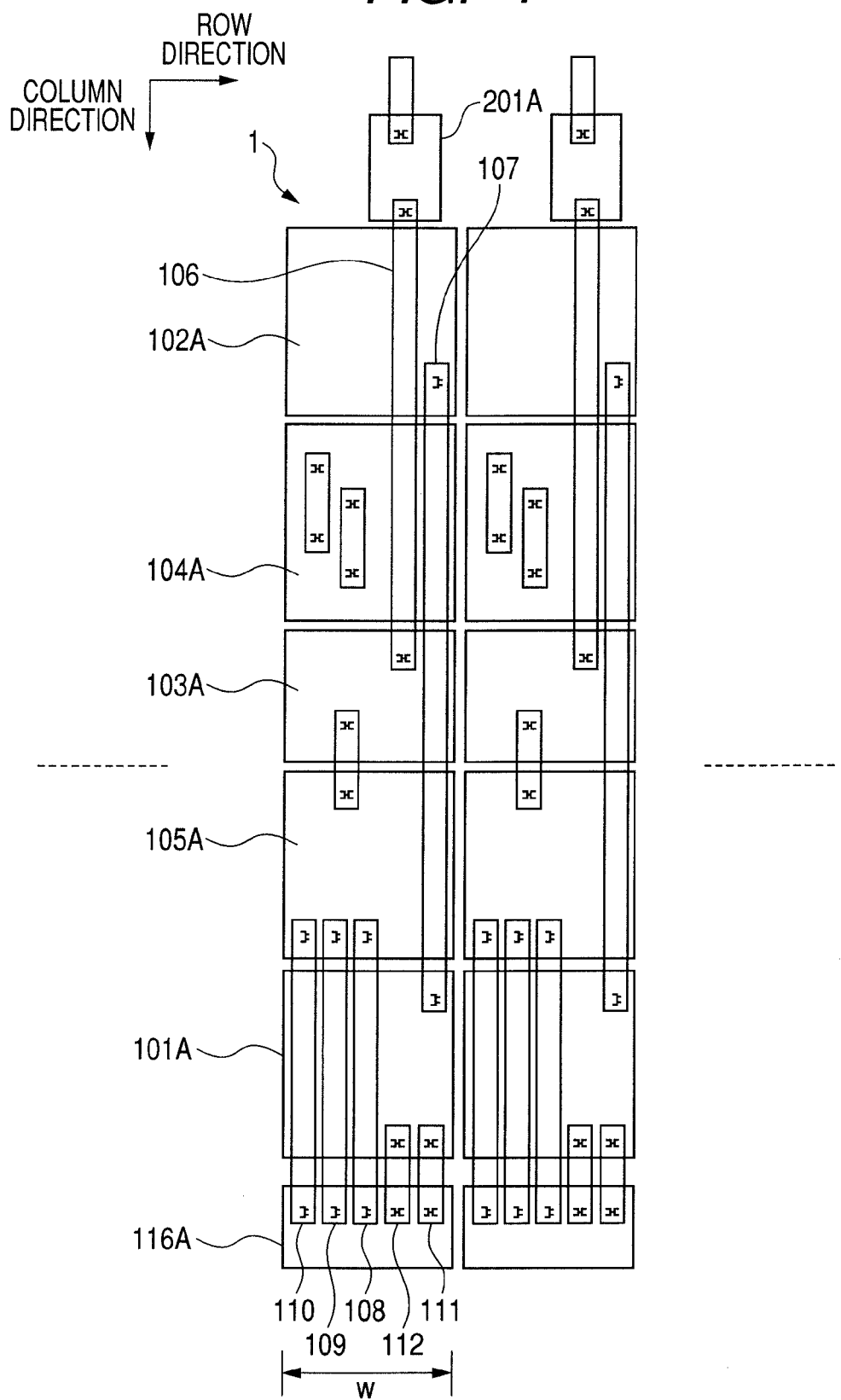

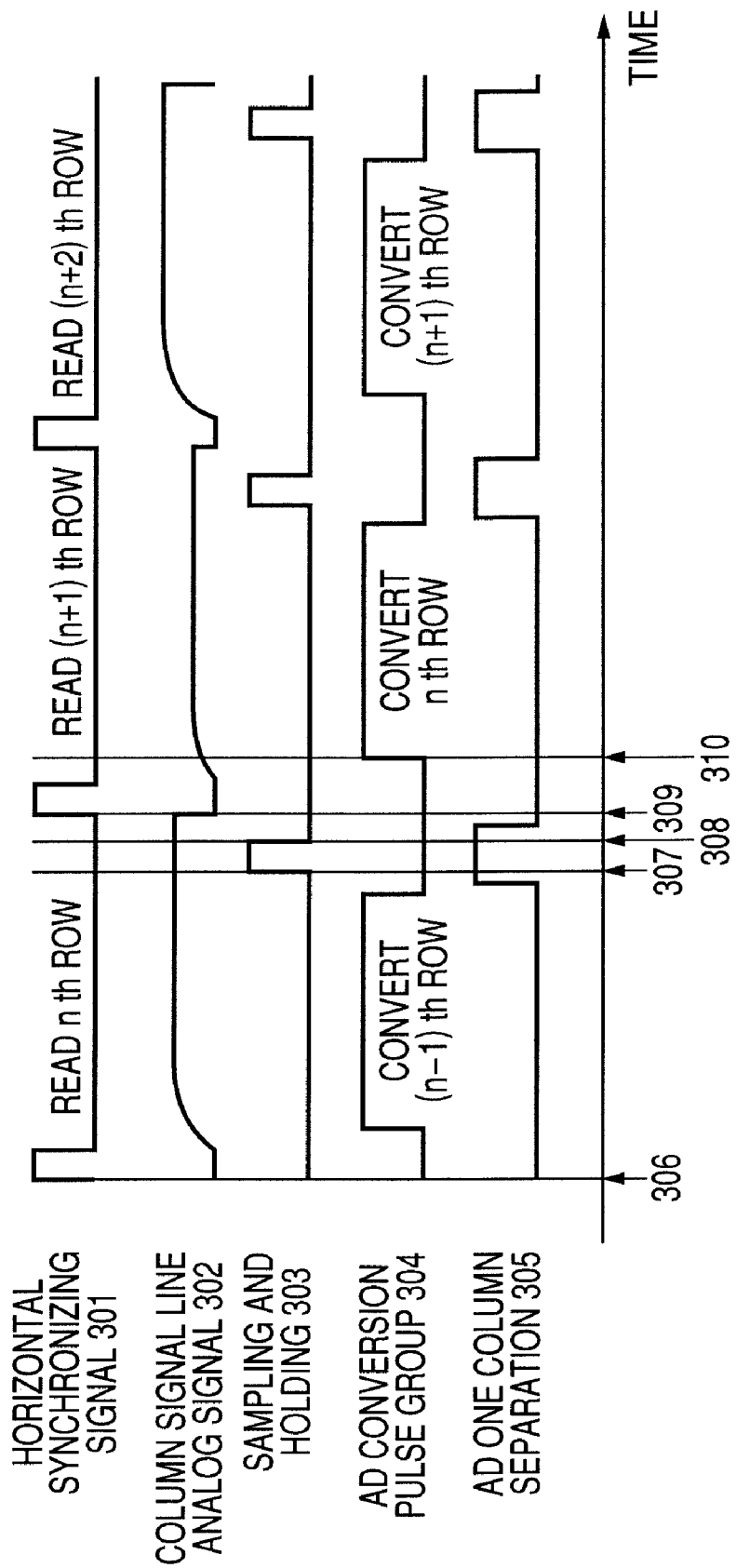

PHOTOELECTRIC CONVERSION APPARATUS

BACKGROUND OF THE INVENTION

1. Field of the Invention

The present invention relates to a photoelectric conversion apparatus, and more specifically relates to an arrangement of an AD converter that converts analog signals obtained by means of photoelectric conversion to digital signals.

2. Description of the Related Art

Currently, MOS-type photoelectric conversion apparatuses are used for photoelectric conversion apparatuses employed in digital cameras and digital video recorders and the like. An MOS-type photoelectric conversion apparatus has many advantages compared to a CCD or the like, because circuits, such as a circuit for controlling the reading of signals from pixels and a circuit for processing output signals, can be formed in the same processes. In recent years, there arises a need for further increasing the speed of signal output in MOS-type photoelectric conversion apparatuses, and as one of the techniques for meeting that need, a construction having a plurality of AD converters each provided for each of a plurality of pixels, has been considered. For example, an AD converter can be provided for each of the pixel columns in the construction where pixels are arranged in a matrix such that analog data can be converted to digital data by column, thereby increasing the speed.

As one of such constructions, Japanese Patent Application Laid-Open No. 2005-136540 discloses a photoelectric conversion apparatus having a recursive AD converter provided for each column. This apparatus has a photoelectric conversion region with a plurality of pixels arranged therein, and a plurality of AD converters, arranged on the same semiconductor substrate.

The recursive AD converter disclosed in Japanese Patent Application Laid-Open No. 2005-136540 repeats comparison with a reference signal and amplification via an arithmetic amplifying circuit and a DA conversion circuit to calculate the result, starting from a higher order bit. Such recursive AD converter requires a path for feeding a signal obtained by decoding an output from a comparator back to a DA converter.

Conventionally, no sufficient consideration has been made for the relationship between this feedback path and the arrangement of elements constituting an AD converter. The present inventors' study has revealed that where the elements are arranged following the flow of a signal in the AD converter, the arrangement pitch of the elements constituting the AD converter may determine the arrangement pitch per pixel column.

In view of such technical problems, an object of the present invention is to provide a configuration that, when an AD converter is provided for each of pixel columns or each plurality of pixel columns, enables the elements to be arranged without increasing the element arrangement pitch for the pixel columns.

SUMMARY OF THE INVENTION

In view of the aforementioned problems, the present invention provides a photoelectric conversion apparatus having a plurality of AD converters each provided for each of a plurality of pixels, the plurality of AD converters and the plurality of pixels being arranged in the same semiconductor substrate, wherein a signal line is provided for transmitting a signal from the plurality of pixels to the plurality of AD converters, the AD converter comprises: an arithmetic operation amplifying circuit unit for inputting as an input signal the signal from the signal line; a comparator circuit unit for comparing, with a reference signal, an output from the arithmetic operation amplifying circuit unit; a DA converted circuit unit for DA converting a signal based on a signal from the comparator circuit unit; and a sampling and holding unit arranged at an input section of the arithmetic operation amplifying circuit unit to hold the input signal of the arithmetic operation amplifying circuit unit, and the comparator circuit unit is arranged in a first region of the semiconductor substrate, the arithmetic operation amplifying circuit unit is arranged in a second region of the semiconductor substrate, and the DA converted circuit unit is arranged in a third region between the first and second regions of the semiconductor substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 is a schematic diagram illustrating a wiring arrangement in an AD converter according to a second embodiment.

FIG. 5 is a schematic diagram for describing an example of drive pulses for a photoelectric conversion apparatus according to a second embodiment.

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail in accordance with the accompanying drawings.

First Embodiment

Figure 1:
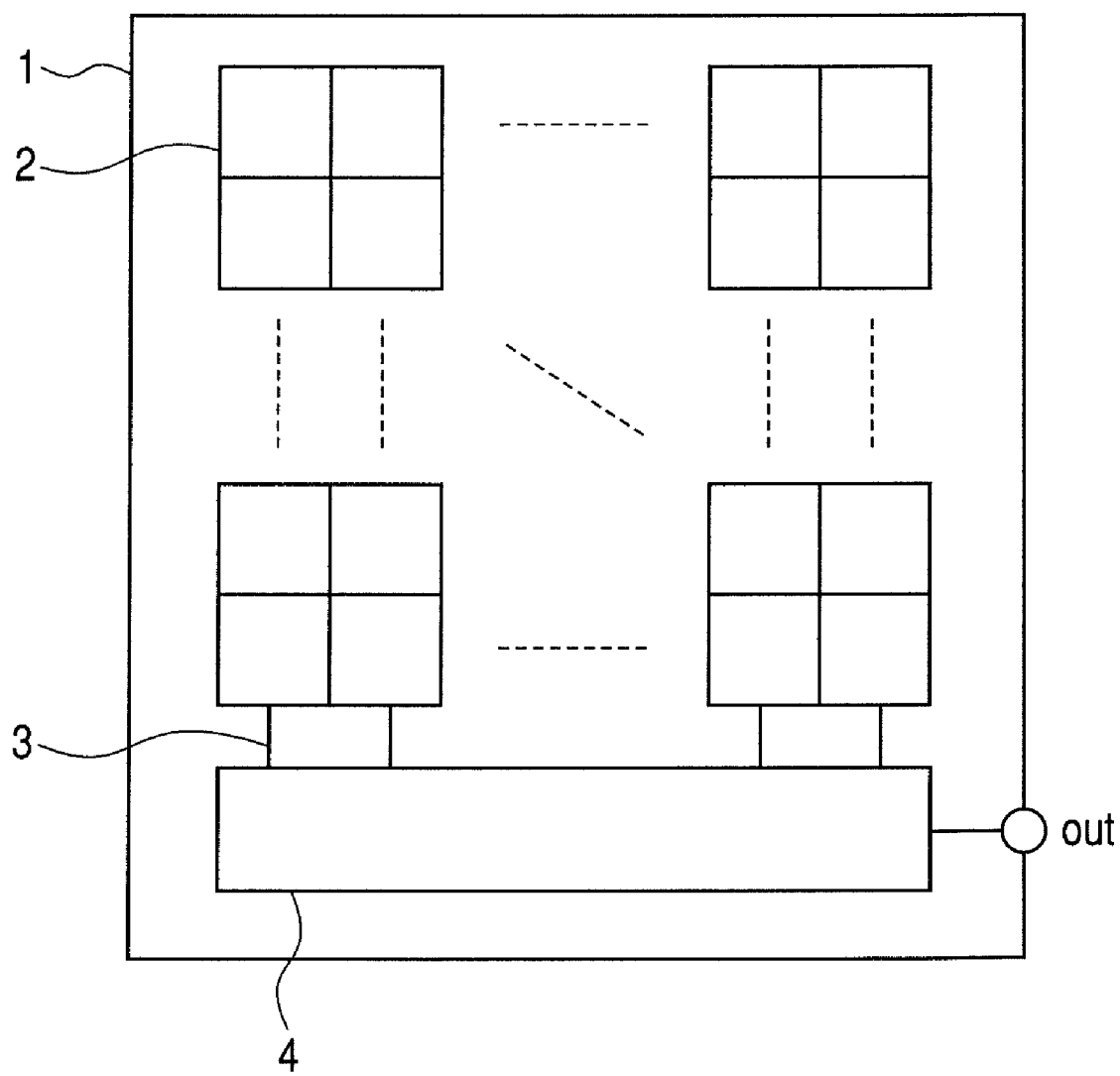
FIG. 1 is a schematic diagram illustrating an example of a photoelectric conversion apparatus according to the present invention.

FIG. 1 is a schematic diagram for describing a photoelectric conversion apparatus according to the present invention. FIG. 1 shows a semiconductor substrate 1. Pixels 2 each include a photoelectric conversion element that performs photoelectric conversion of incident light, and a switch, such as an MOS transistor, for reading signals accumulated in the photoelectric conversion element. Signals from the pixels are transferred via the respective signal lines 3 to AD converters arranged for the respective columns. In a region 4, a plurality of AD converters each provided for each plurality of pixels is arranged. For example, one AD converter is arranged for one column in a matrix of pixels. The plurality of pixels 2 and the plurality of AD converters are arranged in the same semiconductor substrate 1. Each one of the AD converters may be provided correspondingly to one column of the matrix of the pixels, or two or more of the AD converters may be provided correspondingly to one column of the matrix of the pixels.

Figure 2:
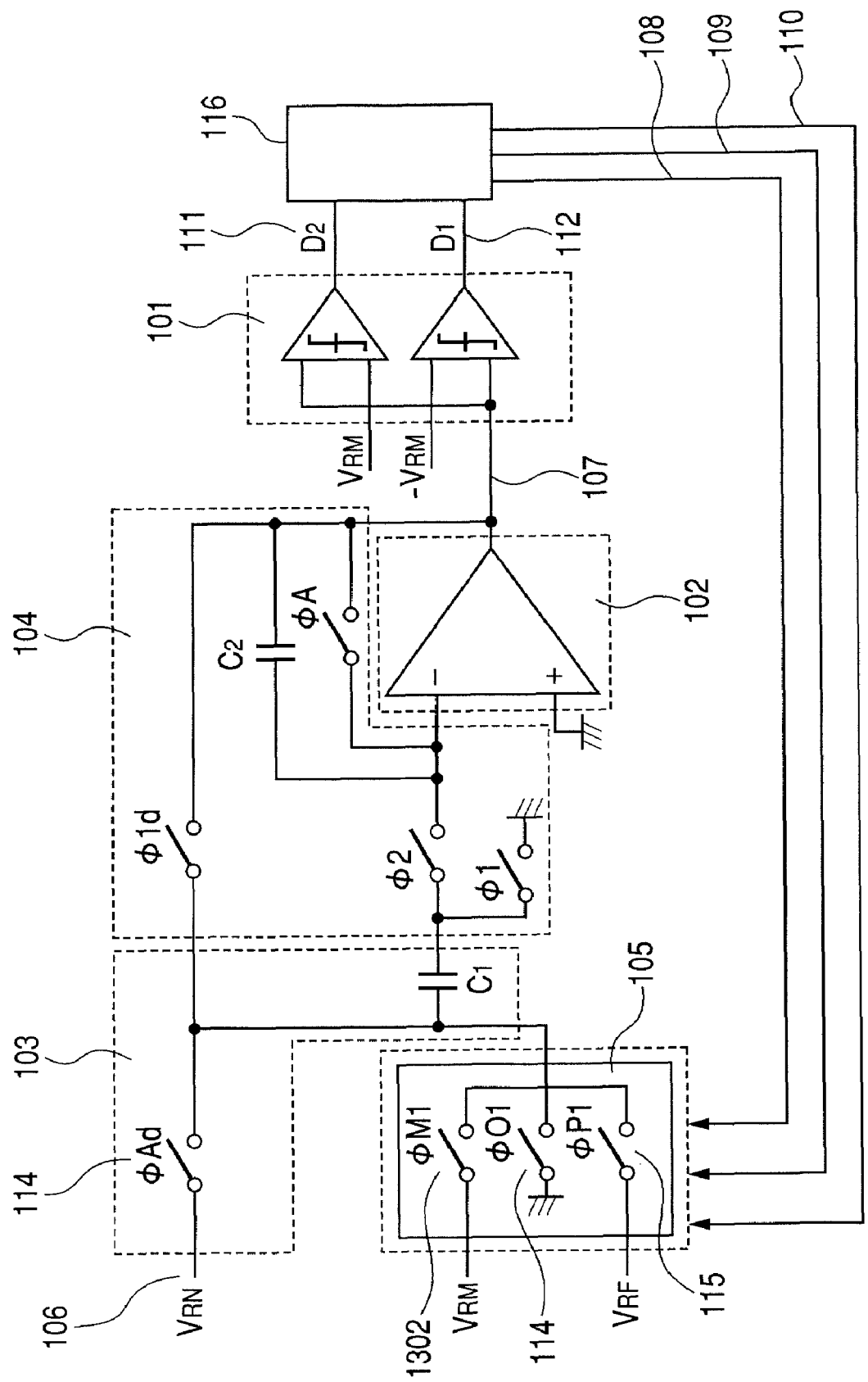
FIG. 2 is a diagram illustrating an example of an AD converter according to the present invention.

FIG. 2 illustrates an example of an AD converter provided for each column or each plurality of columns.

The AD converter includes: a comparator circuit unit 101; an arithmetic operation amplifying circuit unit 102; a sampling and holding unit 103; a capacitor C1 for sampling and holding signals from the pixels; a feedback capacitor C2 for the arithmetic operation amplifying circuit unit; and a circuit element group 104 including the capacitors C1 and C2, a switch provided at an input terminal of the arithmetic operation amplifying circuit unit, and a switch provided in a feedback path.

The AD converter also includes: a DA converted circuit unit 105; an input section 106 of the AD converter to which signals from a plurality of pixels are input; and a wiring 107. The wiring 107 functions as a signal path that transfers an output from the arithmetic operation amplifying circuit unit 102 to the comparator circuit unit 101. Hereinafter, the term "wiring" refers to one that functions as a signal path that conveys signals between different devices or nodes.

The AD converter also includes: a decoder unit 116 that decodes the result of comparison between an output from the arithmetic operation amplifying circuit unit, the output having been processed in the comparator circuit unit, and a reference signal; wirings 111 and 112 that transfer outputs from the comparator circuit unit to the decoder unit; wirings 108, 109 and 110 that transfer signals after the process in the decoder unit to the DA converted circuit unit; and a group of switches 113 to 115 included in the DA converted circuit unit. The switches 113 to 115 are driven by signals from the wirings 108 to 110. The switch 114 is a switch for sampling and holding signals from the pixels, which are sent to the capacitor C1 via a signal line. The AD converter can be operated in such a manner as one disclosed in Japanese Patent Application Laid-Open No. 2005-136540.

Where a photoelectric conversion apparatus has such an AD converter as a component, as the pixels in the photoelectric conversion apparatus become finer (for example, the pixel arrangement pitch becomes 2.0 μm or less), a larger limitation is imposed on the arrangement of the AD converter on the semiconductor substrate. Thus, it becomes necessary to arrange all of the elements constituting the AD converter in a small region. In addition, it is necessary to provide such arrangement without increasing the number of wiring layers. The necessary number of wirings included in the AD converter is predetermined, and the necessary number of wirings does not change even though the pixel arrangement pitch becomes finer. For a general device, where the pixel arrangement pitch is made to be finer and all of the wirings in the AD converter can not be included in one wiring layer, it is conceivable to provide multiple wiring layers. However, for a photoelectric conversion apparatus, it is necessary to make the distance from a light receiving of a photoelectric conversion element to the outermost surface of the photoelectric conversion apparatus as short as possible for easy collection of incident light. Accordingly, it is not favorable to increase the number of wiring layers without careful consideration because such increase may cause deterioration of the properties of the photoelectric conversion apparatus. Accordingly, given that the number of wiring layers cannot be increased to avoid deterioration of the properties as a photoelectric conversion apparatus, it is inevitable to make the arrangement pitch for the AD converter wider than the pixel arrangement pitch. However, the pixel arrangement pitch does not depend on the AD converter pitch, but on the necessary number of pixels and the optical format used for the camera. Also, the number of pixel columns handled by one AD converter is determined by the signal reading speed, and thus, the number of pixel columns handled cannot be determined according to the arrangement pitch required by the AD converter.

As described above, more consideration has been needed for an AD converter arrangement that provides a finer pixel arrangement pitch, while maintaining or enhancing the properties of the photoelectric conversion apparatus. Meanwhile, as a result of diligent study, the present inventors have made the present invention that enables easy arrangement of an AD converter in a small pixel arrangement pitch without deteriorating the properties as a photoelectric conversion apparatus.

Figure 3:
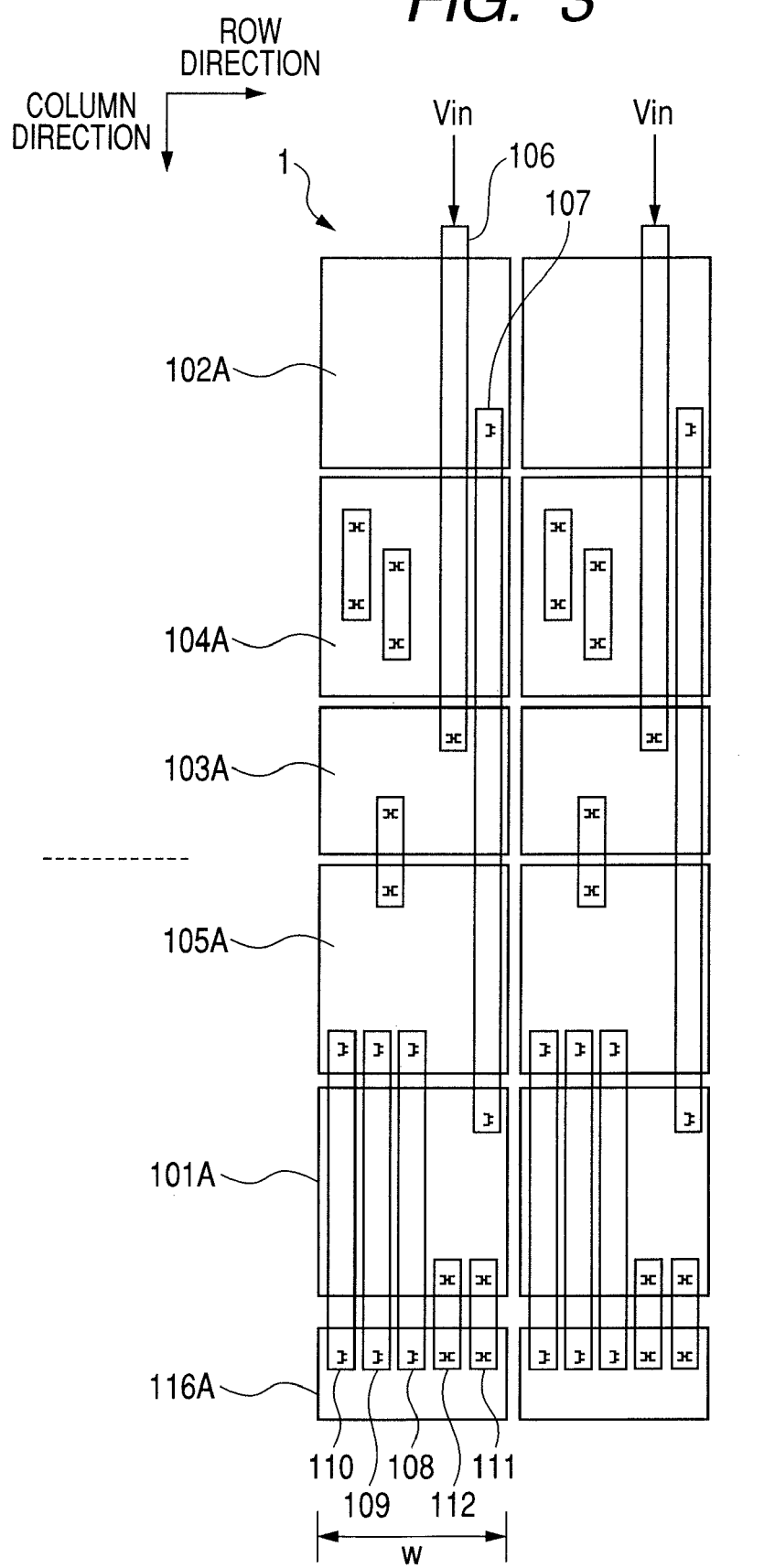
FIG. 3 is a schematic diagram illustrating a wiring arrangement in an AD converter according to a first embodiment.

FIG. 3 shows an embodiment of an arrangement of an AD converter according to an embodiment of the present invention in a semiconductor substrate. The components having the same functions as those shown in FIG. 2 are provided with the same reference numerals and the detailed description thereof will be omitted. The regions provided with letter "A" in addition to the reference numerals are regions of the semiconductor substrate 1 where the respective circuit units are arranged.

A comparator circuit unit 101 is arranged in a first region 101A of a semiconductor substrate 1, and an arithmetic operation amplifying circuit unit 102 is provided in a second region 102A of the semiconductor substrate 1. A DA converted circuit unit 105 is arranged in a third region 103A between the first region 101A and the second region 102A. Such arrangement prevents the wirings from being arranged densely in a particular region, and enhances the degree of freedom for the wiring arrangement in the AD converter.

Here, where the respective circuit units are connection in such a manner as shown in FIG. 2, the wirings connecting the respective circuit units can be shortened by arranging the circuit units and element groups in the order of signal conveyance. In other words, where the DA converted circuit unit 105, the arithmetic operation amplifying circuit unit 102 and the comparator circuit unit 101 are arranged in the semiconductor substrate in this order, the wirings connecting the circuit units can be shortened. However, such arrangement increases the number of wirings running over the arithmetic operation amplifying circuit unit, which results in a wider AD converter arrangement pitch. Using multiple wiring layers, the wirings can be allocated to different wiring layers, enabling the arrangement without increasing the pitch. However, as described above, the number of wiring layers should be small in a photoelectric conversion apparatus, and accordingly, it may be difficult to provide multiple wiring layers for wirings arranged in the column direction.

Here, the reason why the number of wirings running in the column direction over the arithmetic operation amplifying circuit unit is particularly large will be described. An arithmetic operation amplifying circuit is a circuit configured by combining, for example, a differential amplifying circuit and an impedance conversion circuit, and requires a minimum of five transistors. Furthermore, where a high open loop gain is necessary, or where it is necessary to drive a large load, the number of transistors should be further increased and accordingly, a large number of transistors are required. In order to include these transistors in the arrangement pitch determined by the pixel arrangement pitch, it is necessary to closely arrange the transistors in the column direction. With such arrangement, there is no choice but to arrange the wirings for connecting the transistors in such a manner that the wirings extend in one direction such as the column direction. Accordingly, a large number of wirings connecting the transistors included in the arithmetic operation amplifying circuit need to be arranged over the arithmetic operation amplifying circuit unit. In such a situation, further arrangement of the wirings 108, 109 and 110 constituting a feedback loop from a decoder to the DA converted circuit unit over the arithmetic operation amplifying circuit increases the arrangement pitch for the AD converter. More specifically, where, viewed from the comparator circuit unit, the DA converted circuit unit is arranged on the opposite side across the arithmetic operation amplifying circuit unit, the number of wiring layers arranged over the arithmetic operation amplifying circuit increases by at least three (108 to 110). In other words, the arrangement pitch for the wring layer including the wirings extending in at least the column direction will be increased by the triple of the sum of the minimum wiring width and the interval between the minimum wirings (i.e., line and space). When wirings are arranged so as to cover the entire arithmetic operation amplifying circuit unit, feedback wirings need to be arranged so as to avoid the arithmetic operation amplifying circuit unit, which increases the arrangement pitch for the AD converter by that amount.

Meanwhile, arrangement of the circuits as shown in FIG. 3 enables reduction of the wirings extending in the column direction, which are arranged in the second region 102A where the arithmetic operation amplifying circuit unit is arranged, and thus, the arrangement pitch for the AD converter can be decreased.

Next, an example of allocation of wirings to the respective wiring layers will be described. For example, there are three wiring layers in total, wiring extending in the column direction are allocated mainly to a first layer, which is the lowermost layer, control wirings extending in the row direction are mainly allocated to a second layer, which follows the first layer, and power supply lines extending in the row direction are mainly allocated to a third layer, which is the uppermost layer. Here, the wirings included in the first layer are used for data conveyance between the circuit units included in the AD converter, local connections in the circuits, configuration of a negative feedback loop in the AD converter, and transmission of signals from the comparator to the DA converter. The wirings included in the second layer are used for supply of a control signal to determine the timing for an operation performed simultaneously in the respective columns. An example of the wirings is a wiring for controlling the time for a sampling and holding operation of a column signal in each column. The wirings included in the third layer are used for supplying a reference voltage or a drive voltage in common to the DA converted circuit unit, the comparator circuit unit, the arithmetic operation amplifying circuit unit and the like in each column. Also, FIG. 3 shows main ones from among the wirings included in the lowermost first layer. The number of these wirings changes according to the number of transistors.

Also, even when there are two or more wiring layers extending in the column direction, a similar effect can be obtained. This example enables reduction of the number of wirings extending in the column direction over the arithmetic operation amplifying circuit unit.

Furthermore, in this example, considering the connection between the DA converted circuit unit and the sampling and holding unit, the arrangement viewed from an input section (VIN) of the AD converter is made as follows so that the DA converted circuit unit and the sampling and holding unit are close to each other. The region 102A where the arithmetic operation amplifying circuit unit is provided, a region 104A where a circuit element group is provided, the region 103A where the sampling and holding unit is provided, a region 105A where the DA converted circuit unit is provided, and a region 101A where the comparator circuit unit is provided are arranged in this order. As described with reference to FIG. 2, a signal from the DA converted circuit unit is input to the sampling and holding unit. Accordingly, such arrangement can reduce the number of wirings over the arithmetic operation amplifying circuit unit while shortening the signal path from the DA converter to the sampling and holding unit.

The embodiment described above enables an AD converter to be arranged in a favorable manner in a pitch determined by a pixel arrangement pitch or the like, without deteriorating the properties of the photoelectric conversion apparatus even when a finer pixel arrangement pitch is employed.

Second Embodiment

FIG. 4 is a schematic diagram of an arrangement in an AD converter according to a second embodiment. The components having the same functions as those of the first embodiment are provided with the same reference numerals and the detailed description thereof will be omitted. Also, for the overall configuration of the photoelectric conversion apparatus, one shown in the schematic diagram in FIG. 1 can be employed.

The second embodiment is different from the first embodiment in that a connection control switch is provided between an input section of an AD converter to which signals from pixels are input and a signal line. In FIG. 4, the connection control switch is arranged in a region 201A. In other words, a switch is added at a stage preceding the sampling and holding switch 114 in FIG. 2. The provision of this connection control switch controllably enables electric connection between the AD converter and the signal line.

A drive sequence of the present embodiment including the connection control switch will be described with reference to FIG. 5. FIG. 5 represents an ongoing pipeline operation that performs an operation to output an output from the pixel in a certain row (for example, the n-th row) to the signal line and an operation to perform AD conversion of a signal from the pixel in the n−1th row, the signal being held by the sampling and holding unit 103, in parallel.

Pixel rows to be read are controlled in synchronization with pulses of a horizontal synchronizing signal 301. A column signal line analog signal 302 indicates voltage changes in the signal line, and is based on the signals from the pixels. Pulses 303 control the sampling and holding switch 114. The switch is turned on at a "High" level, and holds a signal from the signal line (voltage of the signal line). Pulses for enabling AD conversion operations are collectively illustrated as a pulse group 304. During the periods in which these pulses are at a "High" level, an actual AD conversion is performed for the respective pixel rows. Pulses 305 are supplied to the connection control switch newly provided in the present embodiment. The switch is turned on when the pulses are at a "High" level. The driving of the present embodiment will be described based on FIG. 5.

First, a read operation for the n-th row starts at time 306. The voltage of the signal line changes based on a signal from the pixel. At time 307 when the voltage of the signal line becomes stable, the sampling and holding switch is turned on and the sampling and holding unit samples the voltage of the signal line as an input signal for the AD converter.

Next, the pulse supplied to the switch 114 is made to be low at time 308. Subsequently, the pulse supplied to the connection control switch is made to be low to turn the switch off at time 309. AD conversion of a pixel signal in the n-th row is started at time 310, and a signal from the pixel in the following n+1th row is read to the signal line. The voltage of the signal line changes based on the pixel signal. The above operation is repeated for each row.

Here, the effect of the connection control switch being added will be described. The addition of this switch enables the control of electric connection between the signal line and the AD converter, whereby the effect of voltage changes in the signal line can be prevented from being imposed on the AD converter. When a signal line and an AD converter are electrically connected, a voltage change in the signal line affects an AD conversion operation via a parasitic capacitance. However, addition of a connection control switch enables the electric connection between the AD converter and the signal line to be disconnected during an AD conversion operation, whereby the effect of voltage changes in the signal line can be prevented from being imposed on the AD conversion operation. This is highly effective especially where it is difficult to arrange the sampling and holding unit close to the signal line.

This is particularly important where the circuit units are arranged as illustrated in FIG. 4. As described for the first embodiment, where the number of wirings over the arithmetic operation amplifying circuit unit is reduced while the signal path from the DA converter to the sampling and holding unit being shortened, it is difficult to arrange the sampling and holding unit close to the signal line. In such a case, particularly, the AD converter is susceptible to voltage changes in the signal line, and accordingly, it is highly effective to provide a connection control switch.

Also, the effect of voltage changes in the signal line may be a large problem especially in high-bit AD conversion, and accordingly, a high advantageous effect can be obtained especially when an AD converter with resolution of 14 bits or more, for example, is used.

Although the present invention has been described above by referring to embodiments, the present invention is not limited to these embodiments, and changes and combinations can arbitrarily be adopted as far as they do not fall out of the spirit and scope of the present invention. For example, although the description has been made on a recursive AD converter using a 1.5-bit single end MDAC (Multiplying Digital-To-Analog Converter) for the AD converter, an AD converter using a 1-bit single end MDAC or a 1.5-bit total differential type MDAC may also be employed. In addition, a similar advantageous effect can be exerted where an active amplification is performed in a DA converter in a successive approximation-type AD converter or where double integration-type AD converter is used. The present invention can be employed for an AD converter requiring an arithmetic operation amplifying circuit that substantially occupies the wirings in the wiring layer including wirings extending in the column direction. A wiring that conveys feedback signals from the comparator circuit unit is arranged so as not to run over the arithmetic operation amplifying circuit, enables an arrangement pitch required for a column AD converter to be decreased, and such advantageous effect can be exerted irrespective of the AD converter type.

Also, although the description has been made on the mode in which signals are read from the pixels directly to the signal line, an amplifier (column amplifier) may be provided for each pixel column or a CDS-processing clamp circuit that suppresses reset noise in the pixels may be provided. Also, for an operation timing for reading, the description has been made based on a pipeline operation that performs an operation for reading a signal from a pixel and an AD conversion operation in parallel, but the present invention is not limited to this case, and a configuration with which these operations are sequentially performed may be employed. Furthermore, the voltage value of the signal line during an AD conversion may become unstable due to initialization of the pixels, which may affect the AD conversion operation. The switch added in the second embodiment can prevent such effect from being imposed on the AD conversion operation.

Both of the aforementioned embodiments are mere examples of embodiments for practicing the present invention, and the technical scope of the present inventions should not be interpreted to be limited by these embodiments. In other words, the present invention can be practiced in various manners as far as the practice does not fall out of the technical idea or the main features of the present invention.

This application claims the benefit of Japanese Patent Application No. 2007-178394, filed Jul. 6, 2007, which is hereby incorporated by reference herein in its entirety.

What is claimed is:

1. A photoelectric conversion apparatus having a plurality of AD converters each provided for each of a plurality of pixels, the plurality of AD converters and the plurality of pixels being arranged in the same semiconductor substrate, wherein
 a signal line is provided for transmitting a signal from the plurality of pixels to the AD converter,
 the AD converter comprises:
 an arithmetic operation amplifying circuit unit for inputting as an input signal the signal from the signal line;
 a comparator circuit unit for comparing, with a reference signal, an output from the arithmetic operation amplifying circuit unit;
 a DA converted circuit unit for DA converting a signal based on a signal from the comparator circuit unit; and
 a sampling and holding unit arranged at an input section of the arithmetic operation amplifying circuit unit to hold the input signal of the arithmetic operation amplifying circuit unit, and
 the comparator circuit unit is arranged in a first region of the semiconductor substrate, the arithmetic operation amplifying circuit unit is arranged in a second region of the semiconductor substrate, and the DA converted circuit unit is arranged in a third region between the first and second regions of the semiconductor substrate.

2. The photoelectric conversion apparatus according to claim 1, wherein
 the pixels are arranged in a matrix configuration, such that each one of the AD converters is provided correspondingly to one column of the matrix of the pixels.

3. The photoelectric conversion apparatus according to claim 1, wherein
 the pixels are arranged in a matrix configuration, such that two or more of the AD converters are provided correspondingly to one column of the matrix of the pixels.

4. The photoelectric conversion apparatus according to claim 1, wherein
 the sampling and holding unit is arranged in a fourth region between the second third regions of the semiconductor substrate.

5. The photoelectric conversion apparatus according to claim 1, further comprising:
 a switch arranged between the signal line and the AD converter for controlling electrical connection between the signal line and the AD converter.

6. The photoelectric conversion apparatus according to claim 1, wherein
 the AD converter is a recursive AD converter.

* * * * *